(12) United States Patent
Wang et al.

(10) Patent No.: US 11,380,628 B2
(45) Date of Patent: Jul. 5, 2022

(54) MOTHER SUBSTRATE FOR DISPLAY SUBSTRATES, MANUFACTURE METHOD THEREOF, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Yingsong Xu, Beijing (CN); Haijun Yin, Beijing (CN)

(73) Assignees: CHENGDU BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 594 days.

(21) Appl. No.: 16/342,445

(22) PCT Filed: Aug. 8, 2018

(86) PCT No.: PCT/CN2018/099325
§ 371 (c)(1),
(2) Date: Apr. 16, 2019

(87) PCT Pub. No.: WO2019/076103
PCT Pub. Date: Apr. 25, 2019

(65) Prior Publication Data
US 2021/0375784 A1 Dec. 2, 2021

(30) Foreign Application Priority Data

Oct. 17, 2017 (CN) .......................... 201710966327.8

(51) Int. Cl.
*H01L 23/00* (2006.01)
*H01L 23/58* (2006.01)
*H01L 27/12* (2006.01)

(52) U.S. Cl.
CPC .......... *H01L 23/562* (2013.01); *H01L 23/585* (2013.01); *H01L 27/1214* (2013.01); *H01L 27/1262* (2013.01)

(58) Field of Classification Search
CPC . H01L 23/562; H01L 23/585; H01L 27/1214; H01L 27/1262; H01L 27/3223; H01L 25/167

(Continued)

(56) References Cited

U.S. PATENT DOCUMENTS 9,614,183 B2 * 4/2017 Zhang ................... G09G 3/3208
10,135,028 B2 * 11/2018 Kim ..................... H01L 51/5256

(Continued)

FOREIGN PATENT DOCUMENTS

CN    1336567 A    2/2002
CN    1666332 A    9/2005

(Continued)

OTHER PUBLICATIONS

First Office Action for Chinese Application No. 201710966327.8, dated May 5, 2019, 7 Pages.

(Continued)

*Primary Examiner* — Dao H Nguyen
(74) *Attorney, Agent, or Firm* — Brooks Kushman P.C.

(57) ABSTRACT

A mother substrate for display substrates, a manufacture method thereof, a display substrate and a display device are provided. The mother substrate for display substrates includes multiple display element formation regions and a dividing line surrounding each display element formation region. A recess-protrusion structure is provided between the (Continued)

dividing line and the display element formation region, the recess-protrusion structure includes multiple recesses and protrusions which are arranged alternately, and extension directions of the recess and the protrusion are identical to an extension direction of the dividing line.

20 Claims, 2 Drawing Sheets

(58) Field of Classification Search
USPC ........................................................ 257/620
See application file for complete search history.

(56) References Cited

U.S. PATENT DOCUMENTS

| | | | |
|---|---|---|---|
| 10,847,546 B2 * | 11/2020 | Kwak | ................. H01L 51/5246 |
| 2002/0014470 A1 | 2/2002 | Okada et al. | |
| 2003/0100143 A1 | 5/2003 | Mulligan et al. | |
| 2009/0273589 A1 * | 11/2009 | Asano | ................. H01L 27/3283 |
| | | | 345/204 |
| 2014/0097430 A1 | 4/2014 | Park et al. | |
| 2017/0110526 A1 * | 4/2017 | Eo | ........................ H01L 27/3262 |
| 2017/0117502 A1 * | 4/2017 | Park | ........................ H01L 51/56 |
| 2017/0235396 A1 | 8/2017 | Gong | |

FOREIGN PATENT DOCUMENTS

| | | |
|---|---|---|
| CN | 101336567 A | 12/2008 |
| CN | 103336567 A | 10/2013 |
| CN | 105552077 A | 5/2016 |
| CN | 107634071 A | 1/2018 |
| CN | 207217537 U | 4/2018 |

OTHER PUBLICATIONS

International Search Report and Written Opinion for Application No. PCT/CN2018/099325, dated Nov. 5, 2018, 10 Pages.

* cited by examiner

MOTHER SUBSTRATE FOR DISPLAY SUBSTRATES, MANUFACTURE METHOD THEREOF, DISPLAY SUBSTRATE AND DISPLAY DEVICE

CROSS-REFERENCE TO RELATED APPLICATIONS

This application is the U.S. national phase of PCT Application No. PCT/CN2018/099325 filed on Aug. 8, 2018, which claims priority to Chinese Patent Application No. 201710966327.8 filed on Oct. 17, 2017, which are incorporated herein by reference in their entireties.

TECHNICAL FIELD

The present disclosure relates to the field of display technology, in particular to a mother substrate for display substrates, a manufacture method thereof, a display substrate and a display device.

BACKGROUND

In manufacture process for a liquid crystal display (Liquid Crystal Display, LCD) or an organic light-emitting diode (Organic Light-Emitting Diode, OLED), manufacture technique of large plate is generally used in front end, in which multiple structures corresponding to display substrates are formed in a mother substrate for display substrates, the mother substrate for display substrates is divided so as to form multiple display substrates, and the display substrate is assembled to form a display device. In the dividing process of the mother substrate for display substrates, a crack is formed by gashing the mother substrate for display substrates along a dividing line, and an impact force and other external forces are applied to the part with the crack so that the mother substrate for display substrates is divided into multiple display substrates along the dividing line. Other dividing methods may be used in the dividing process of the mother substrate for display substrates, such as irradiating along the dividing line of the mother substrate for display substrates with a laser, and partially heating the mother substrate for display substrates to generate a crack, so as to divide the mother substrate for display substrates.

SUMMARY

A mother substrate for display substrates, a manufacture method thereof, a display substrate and a display device are provided according to the present disclosure.

In a first aspect, a mother substrate for display substrates is provided. The mother substrate for display substrates includes multiple display element formation regions and a dividing line surrounding each display element formation region.

A recess-protrusion structure is provided between the dividing line and the display element formation region, the recess-protrusion structure includes multiple recesses and protrusions which are arranged alternately, and extension directions of the recess and the protrusion are identical to an extension direction of the dividing line.

Optionally, a bottom of the recess is higher than a bottom of the protrusion.

Optionally, a bottom width of the protrusion is smaller than a top width of the protrusion.

Optionally, the protrusion is continuously formed surrounding the display element formation region; and/or the recess is continuously formed surrounding the display element formation region.

Optionally, the recess-protrusion structure is covered with a protective film.

Optionally, a height difference between the protrusion and the recess is greater than a thickness of the protective film.

Optionally, the recess-protrusion structure is formed of an organic material or a metal material.

Optionally, in a case that the recess-protrusion structure is formed of a metal material, the recess-protrusion structure and a source-drain metal layer pattern of the mother substrate for display substrates are formed of a same material, or the recess-protrusion structure and a gate metal layer pattern of the mother substrate for display substrates are formed of a same material.

In a second aspect, a display substrate is provided, which is formed by dividing the mother substrate for display substrates as described above.

In a third aspect, a display device is provided, which includes the display substrate as described above.

In a fourth aspect, a method for manufacturing a mother substrate for display substrates is provided, the mother substrate for display substrates including multiple display element formation regions and a dividing line formed surrounding each display element formation region, where the method includes:

at least forming a material layer at a region between the dividing line and the display element formation region, and patterning the material layer to form a recess-protrusion structure, where the recess-protrusion structure includes multiple recesses and protrusions which are arranged alternately, and extension directions of the recess and the protrusion are identical to an extension direction of the dividing line.

Optionally, after forming the recess-protrusion structure, the method further includes:

forming a protective film on the recess-protrusion structure.

Optionally, forming the recess-protrusion structure includes:

forming a source-drain metal layer pattern of the mother substrate for display substrates and the recess-protrusion structure through a single patterning process;

or forming a gate metal layer pattern of the mother substrate for display substrates and the recess-protrusion structure through a single patterning process.

DETAILED DESCRIPTION

To better clarify the technical problem to be solved, the technical solutions and the technical effects of embodiments of the present disclosure, detailed descriptions are provided hereinafter in conjunction with drawings and embodiments.

In related technologies, a cutting crack may be easily generated when wheel cutter cutting or laser cutting is performed on a mother substrate for display substrates. If the crack propagates to the inside of the display substrate, the display substrate may fail, reducing the yield of display substrate.

Figure 1:
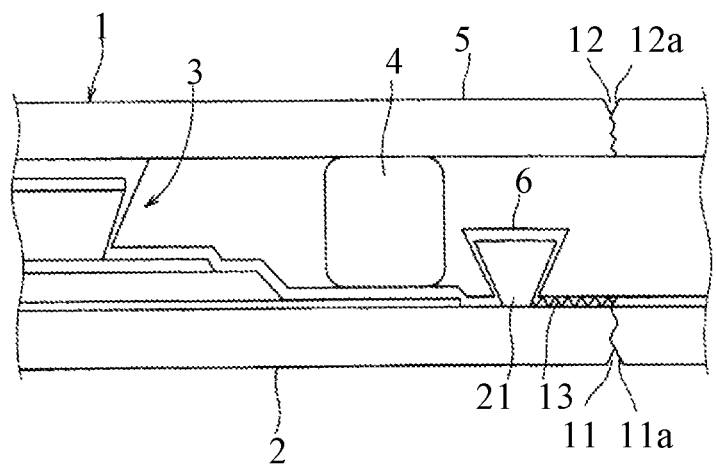
FIG. 1 is a schematic structural diagram of a mother substrate for display substrates in related technologies.

FIG. 1 is a schematic structural diagram of a mother substrate for display substrates in related technologies. As shown in FIG. 1, a display device 1 includes a display substrate formed by cutting a mother substrate for display substrates 2, and the substrate and a cover glass 5 are sealed with a sealing element 4 after cell alignment is performed on the substrate and the cover glass 5. Multiple display element formation regions 3 are provided in the mother substrate for display substrates 2, and a display element may be provided in each display element formation region 3, where the display element may include a thin film transistor, an electrode for display and a signal wire for transmitting signals. In order to block propagation of a lateral cutting crack 13 generated during cutting the mother substrate for display substrates 2, a column of bumps 21 are provided between the display element formation region 3 and a dividing line (11, 11a, 12 and 12a), and the extension directions of the bumps 21 are identical to the extension direction of the dividing line, which may be substantially parallel, optionally. The bumps 21 may be formed of an organic material such as the same material for forming a spacer, or may be formed of an inorganic material (for example, a metal material) or an insulating inorganic material. The bumps 21 are covered with a protective film 6 which is formed by extending a protective film 6 covering the display element to the bumps 21, so that the propagation of the lateral cutting crack can be blocked by the bumps 21 and the protective film 6 covering the bumps 21.

Nevertheless, the blocking effect of the propagation of the lateral cutting crack with only one column of bumps 21 provided may be unsatisfactory. Therefore, a mother substrate for display substrates, a manufacture method thereof, a display substrate and a display device are provided according to some embodiments of the present disclosure, which can effectively block propagation of a lateral cutting crack in cutting the mother substrate for display substrates, thereby avoiding failure of the display substrate.

Figure 2:
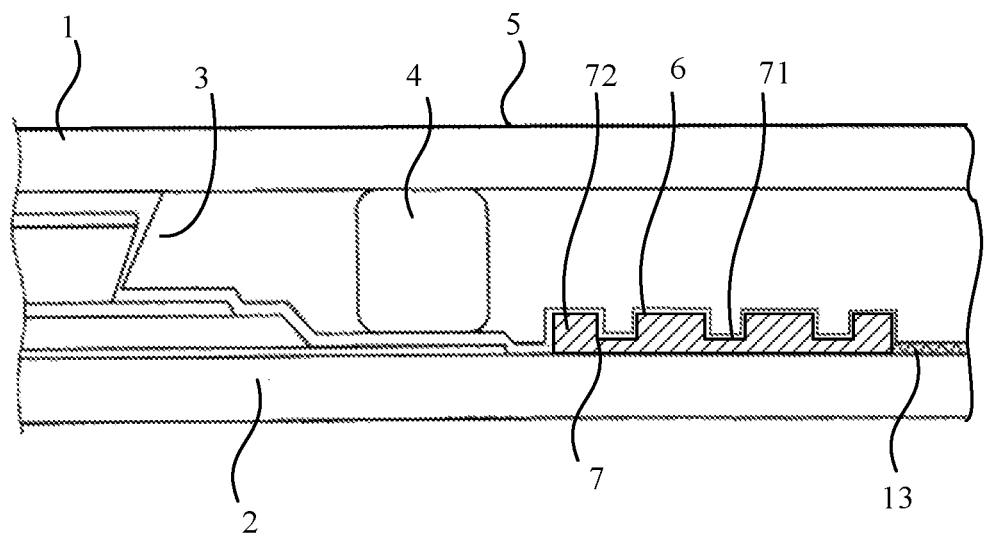
FIG. 2 is a schematic structural diagram of a mother substrate for display substrates according to some embodiments of the present disclosure.

A mother substrate for display substrates is provided according to some embodiments of the present disclosure. FIG. 2 is a schematic structural diagram of a mother substrate for display substrates according to some embodiments of the present disclosure. As shown in FIG. 2, the mother substrate for display substrates includes multiple display element formation regions 3 and a dividing line (not illustrated) surrounding the display element formation region 3. A recess-protrusion structure 7 is provided between the dividing line and the display element formation region 3. The recess-protrusion structure 7 includes multiple recesses 71 and protrusions 72 which are arranged alternately, and extension directions of the recess 71 and the protrusion 72 coincide with an extension direction of the dividing line, which may be substantially parallel.

In some embodiments, the recess-protrusion structure 7 is provided between the dividing line and the display element formation region 3, the recess-protrusion structure 7 includes the recesses 71 and the protrusions 72, and the extension directions of the recess 71 and the protrusion 72 coincide with that of the dividing line, so that the recess-protrusion structure 7 can block propagation of a lateral cutting crack in cutting the mother substrate for display substrates along the dividing line, thereby avoiding failure of a display substrate. In addition, the propagation of the lateral cutting crack can be effectively blocked as the recess-protrusion structure 7 includes multiple recesses 71 and protrusions 72.

The blocking effect of the lateral cutting crack improves as the quantity the recesses 71 and protrusions 72 included in the recess-protrusion structure 7 increases. However, a wide of a frame of the display device increases as the quantity the recesses 71 and protrusions 72 included in the recess-protrusion structure 7 increases. For consideration of a narrow frame of the display device, the recess-protrusion structure 7 may include three to four recesses 71 and three to four protrusions 72, optionally.

As shown in FIG. 2, a bottom of the recess 71 is higher than a bottom of the protrusion 72, that is, the recess 71 has a certain film thickness. When the lateral cutting crack is propagating, the recess 71 with a certain film thickness can absorb stress, and better block the propagation of the lateral cutting crack compared with a recess 71 with a film thickness of 0.

In some embodiments, a cross-sectional shape of the recess 71 may be a rectangle, a trapezoid, an inverted triangle or a semicircle, and a cross-sectional shape of the protrusion 72 may also be a rectangle, a trapezoid, an inverted triangle or a semicircle. In order to simplify the manufacture process, the cross-sectional shapes of the recess 71 and the protrusion 72 are both set to a rectangle, as is shown in FIG. 2.

During cutting the mother substrate for display substrates, in order to better block the propagation of the lateral cutting crack, a middle region of the recess-protrusion structure 7 needs to absorb more stress. Therefore, as shown in FIG. 2, a width of a protrusion 72 located in the middle region of the recess-protrusion structure 7 is greater than a width of a protrusion 72 located in a marginal region of the recess-protrusion structure 7.

The protrusions 72 and the recesses 71 may be arranged in various manners. Specifically, heights of the protrusions 72 may gradually decrease along a direction from near the display element formation region 3 to far away from the display element formation region 3; arrangement densities of the protrusions 72 may gradually decrease along the direction from near the display element formation region 3 to far away from the display element formation region 3; widths of the protrusions 72 may gradually decrease along the direction from near the display element formation region 3 to far away from the display element formation region 3; heights of the protrusions 72 may gradually increase along the direction from near the display element formation region 3 to far away from the display element formation region 3; arrangement densities of the protrusions 72 may gradually increase along the direction from near the display element formation region 3 to far away from the display element formation region 3; or widths of the protrusions 72 may gradually increase along the direction from near the display element formation region 3 to far away from the display element formation region 3.

Further, the recesses 71 and the protrusions 72 may be so arranged that heights of the protrusions 72 gradually decrease along a direction from the middle region of the recess-protrusion structure 7 to the marginal region of the recess-protrusion structure 7; arrangement densities of the protrusions 72 gradually decrease along the direction from the middle region of the recess-protrusion structure 7 to the marginal region of the recess-protrusion structure 7; widths of the protrusions 72 gradually decrease along the direction from the middle region of the recess-protrusion structure 7 to the marginal region of the recess-protrusion structure 7; heights of the protrusions 72 gradually increase along the direction from the middle region of recess-protrusion structure 7 to the marginal region of the recess-protrusion structure 7; arrangement densities of the protrusions 72 gradually increase along the direction from the middle region of the recess-protrusion structure 7 to the marginal region of the recess-protrusion structure 7; or widths of the protrusions 72 gradually increase along the direction from the middle region of the recess-protrusion structure 7 to the marginal region of the recess-protrusion structure 7.

In some optional embodiments, a bottom width of the protrusion 72 is smaller than a top width of the protrusion 72 (not illustrated), that is, the cross-sectional shape of the protrusion 72 is substantially an inverted cone, and during cutting the mother substrate for display substrates along the dividing line, the protrusion 72 with the inverted-cone-shaped cross-section can effectively prevent the propagation of a crack.

In some embodiments, the recess-protrusion structure 7 surrounding the display element formation region 3 may be formed continuously or discontinuously. Optionally, the protrusion 72 is continuously formed surrounding the display element formation region 3, and the recess 71 is also continuously formed surrounding the display element formation region 3, thereby blocking the propagation of the lateral cutting crack around the display element formation region 3 and better protecting the display substrate.

The display element in the display element formation region 3 is covered with a protective film 6, and the protective film 6 may be formed of an insulating material and can protect the display element in the mother substrate for display substrates from ambient interference. Specifically, the protective film 6 may be formed of an inorganic material such as silicon nitride or silicon oxide. In some embodiments, as shown in FIG. 2, the protective film 6 extends outside the display element formation region 3 and covers the recess-protrusion structure 7. Since the protective film 6 can also absorb a certain amount of cutting stress, the propagation of the lateral cutting crack can be better blocked by the protective film 6 and the recess-protrusion structure 7 cooperating with each other.

As shown in FIG. 2, a height difference between the protrusion 72 and the recess 71 is greater than a thickness of the protective film 6, which is for avoiding a situation that adhesive force between the protective film 6 and the protrusion 72 and the recess 71 is affected due to a small height difference between the protrusion 72 and the recess 71 in the recess-protrusion structure 7 and then the blocking of the propagation of the lateral cutting crack by the protective film 6 is affected.

In some embodiments, the recess-protrusion structure 7 may be formed of an organic material or a metal material. In a case that the recess-protrusion structure 7 is formed of an organic material, the organic material may be a soft material, for example, a resin material such as acrylic resin or polyimide resin. The resin material has good flexibility and can better absorb the stress generated during cutting the mother substrate for display substrates.

In a case that the recess-protrusion structure 7 is formed of a metal material, the recess-protrusion structure 7 may be formed with the same material as a source-drain metal layer pattern of the mother substrate for display substrates, so that the recess-protrusion structure 7 may be formed with the source-drain metal layer pattern through a single patterning process without an extra patterning process to form the recess-protrusion structure 7 alone, which can reduce the manufacture cost of the mother substrate for display substrates and improve the productivity of the mother substrate for display substrates. The recess-protrusion structure 7 may be formed with the same material as a gate metal layer pattern of the mother substrate for display substrates, so that the recess-protrusion structure 7 may be formed with the gate metal layer pattern through a single patterning process without an extra patterning process to form the recess-protrusion structure 7 alone, which can reduce the manufacture cost of the mother substrate for display substrates and improve the productivity of the mother substrate for display substrates.

The mother substrate for display substrates according to some embodiments may be a flexible or a rigid mother substrate for display substrates. In a case that the mother substrate for display substrates is a flexible mother substrate for display substrates, a substrate that is adopted may be a flexible substrate, such as a polyimide film. In a case that the mother substrate for display substrates is a rigid mother substrate for display substrates, a substrate that is adopted may be a glass substrate or a quartz substrate.

Figure 3:
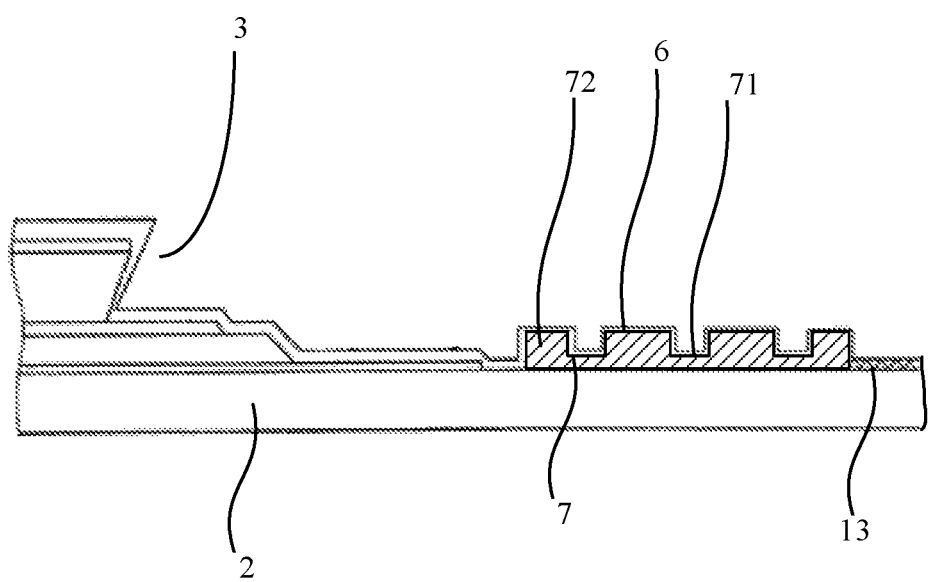
FIG. 3 is a schematic structural diagram of a display substrate according to some embodiments of the present disclosure.

A display substrate is further provided according to some embodiments of the present disclosure, which is formed by cutting the mother substrate for display substrates as described above, as shown in FIG. 3. As the recess-protrusion structure 7 is provided between the dividing line and the display element formation region 3 of the mother substrate for display substrates, the propagation of the lateral cutting crack can be effectively blocked by the recess-protrusion structure 7 when the mother substrate for display substrates is being cut along the dividing line, so that the lateral cutting crack cannot propagate to the inside of the display substrate, thereby effectively improving the yield of the display substrate.

A display device is further provided according to some embodiments of the present disclosure, which includes the display substrate as described above. The display device may be any product or component with a display function, such as a liquid crystal television, a liquid crystal display, a digital photo frame, a cellphone or a tablet computer. The display device may further include a flexible circuit board, a printed circuit board and a backboard.

A method for manufacturing a mother substrate for display substrates is further provided according to some embodiments of the present disclosure, where the mother substrate for display substrates includes multiple display element formation regions 3 and a dividing line surrounding each display element formation region 3. The method for manufacturing the mother substrate for display substrates includes the following steps:

at least forming a material layer at a region between the dividing line and the display element formation region 3, and patterning the material layer to form a recess-protrusion structure 7, where the recess-protrusion structure 7 includes multiple recesses 71 and protrusions 72 which are arranged alternately, and extension directions of both the recess 71 and the protrusion 72 are identical to an extension direction of the dividing line, which may be substantially parallel to each other.

In some embodiments, the recess-protrusion structure 7 is provided between the dividing line and the display element formation region 3, the recess-protrusion structure 7 includes the recesses 71 and the protrusions 72, and the extension directions of the recess 71 and the protrusion 72 are substantially parallel with that of the dividing line. The recess-protrusion structure 7 can effectively block propagation of a lateral cutting crack in cutting the mother substrate for display substrates along the dividing line, thereby avoiding failure of a display substrate. In addition, the propagation of the lateral cutting crack can be better blocked as the recess-protrusion structure 7 includes multiple recesses 71 and protrusions 72.

The blocking effect of the lateral cutting crack improves as the quantity the recesses 71 and protrusions 72 included in the recess-protrusion structure 7 increases. However, for consideration of a narrow frame of the display device, the recess-protrusion structure 7 may include three to four recesses 71 and three to four protrusions 72, optionally.

As shown in FIG. 2, a bottom of the recess 71 formed is higher than a bottom of the protrusion 72, that is, the recess 71 has a certain film thickness. When the lateral cutting crack is propagating, the recess 71 with a certain film thickness can absorb stress, and better block the propagation of the lateral cutting crack compared with a recess 71 with a film thickness of 0.

In some embodiments, a cross-sectional shape of the recess 71 formed may be a rectangle, a trapezoid, an inverted triangle or a semicircle, and a cross-sectional shape of the protrusion 72 formed may also be a rectangle, a trapezoid, an inverted triangle or a semicircle. In order to simplify the manufacture process, the cross-sectional shapes of the recess 71 and the protrusion 72 are both set to a rectangle, as is shown in FIG. 2.

During cutting the mother substrate for display substrates, in order to better block the propagation of the lateral cutting crack, a middle region of the recess-protrusion structure 7 needs to absorb more stress. Therefore, as shown in FIG. 2, a width of a protrusion 72 located in the middle region of the recess-protrusion structure 7 is greater than a width of a protrusion 72 located in a marginal region of the recess-protrusion structure 7.

The protrusions 72 and the recesses 71 may be arranged in various manners. Specifically, heights of the protrusions 72 may gradually decrease along a direction from near the display element formation region 3 to far away from the display element formation region 3; arrangement densities of the protrusions 72 may gradually decrease along the direction from near the display element formation region 3 to far away from the display element formation region 3; widths of the protrusions 72 may gradually decrease along the direction from near the display element formation region 3 to far away from the display element formation region 3; heights of the protrusions 72 may gradually increase along the direction from near the display element formation region 3 to far away from the display element formation region 3; arrangement densities of the protrusions 72 may gradually increase along the direction from near the display element formation region 3 to far away from the display element formation region 3; or widths of the protrusions 72 may gradually increase along the direction from near the display element formation region 3 to far away from the display element formation region 3.

Further, heights of the protrusions 72 gradually decrease along a direction from the middle region of recess-protrusion structure 7 to the marginal region of the recess-protrusion structure 7; arrangement densities of the protrusions 72 gradually decrease along the direction from the middle region of the recess-protrusion structure 7 to the marginal region of the recess-protrusion structure 7; widths of the protrusions 72 gradually decrease along the direction from the middle region of the recess-protrusion structure 7 to the marginal region of the recess-protrusion structure 7; heights of the protrusions 72 gradually increase along the direction from the middle region of recess-protrusion structure 7 to the marginal region of the recess-protrusion structure 7; arrangement densities of the protrusions 72 gradually increase along the direction from the middle region of the recess-protrusion structure 7 to the marginal region of the recess-protrusion structure 7; or widths of the protrusions 72 gradually increase along the direction from the middle region of the recess-protrusion structure 7 to the marginal region of the recess-protrusion structure 7.

In some optional embodiments, a bottom width of the protrusion 72 formed is smaller than a top width of the protrusion 72 (not illustrated), that is, the cross-sectional shape of the protrusion 72 is substantially an inverted cone, and during cutting the mother substrate for display substrates along the dividing line, the protrusion 72 with the inverted-cone-shaped cross-section can more effectively prevent the propagation of a crack.

In some embodiments, the recess-protrusion structure 7 surrounding the display element formation region 3 may be formed continuously or discontinuously. Optionally, the protrusions 72 each are continuously formed surrounding the display element formation region 3, and the recesses 71 each are also continuously formed surrounding the display element formation region 3, thereby blocking the propagation of the lateral cutting crack around the display element formation region 3 and better protecting the display substrate.

As shown in FIG. 2, a height difference between the protrusion 72 and the recess 71 is greater than a thickness of a protective film 6, which is for avoiding a situation that adhesive force between the protective film 6 and the protrusion 72 and the recess 71 is affected due to a height difference between the protrusion 72 and the recess 71 in the recess-protrusion structure 7 and then the blocking of the lateral cutting crack by the protective film 6 is affected.

Further, after forming the recess-protrusion structure 7, the method for manufacturing the mother substrate for display substrates may further include: forming a protective film 6 on the recess-protrusion structure 7.

After a display element is formed in the display element formation region 3, the display element is covered with the protective film 6. The protective film 6 may be formed of an insulating material and can protect the display element in the mother substrate for display substrates from ambient interference. Specifically, the protective film 6 may be formed of an inorganic material such as silicon nitride or silicon oxide. In some embodiments, as shown in FIG. 2, the recess-protrusion structure 7 may be covered by the protective film 6 which extends outside the display element formation region 3. Since the protective film 6 can also absorb a certain amount of cutting stress, the propagation of the lateral cutting crack can be better blocked by the protective film 6 and the recess-protrusion structure 7 cooperating with each other.

The recess-protrusion structure 7 may be formed of an organic material or a metal material. In a case that the recess-protrusion structure 7 is formed of an organic material, the organic material may be a soft material, for example, a resin material such as acrylic resin or polyimide resin. The resin material has good flexibility and can better absorb the stress generated during cutting the mother substrate for display substrates.

Specifically, after the material layer is formed in a peripheral region of the dividing line, photoresist may be coated on the material layer. The photoresist is exposed with a graytone mask or a halftone mask, and after developing, a photoresist-partially-retained region, a photoresist-completely-removed region and a photoresist-completely-retained region are formed. The material layer in the photoresist-completely-retained region is etched, photoresist in the photoresist-partially-retained region is ashed, a part of the photoresist in the photoresist-completely-retained region is retained, and a part of the material layer in the photoresist-partially-retained region is etched, so as to form the recesses 71; and the retained photoresist in the photoresist-completely-retained region is ashed, so as to form the protrusions 72.

Further, in a case that recess-protrusion structure 7 is formed of a photosensitive resin material, photoresist does not need to be coated on the material layer. The photosensitive resin material may be directly exposed with a graytone mask or a halftone mask, and after developing, a photosensitive resin material partially retained region, a photosensitive resin material removed region and a photosensitive resin material completely retained region are formed, where the photosensitive resin material partially retained region forms the recesses 71 and the photosensitive resin material completely retained region forms the protrusions 72.

Further, in a case that the recess-protrusion structure 7 is formed of metal, the recess-protrusion structure 7 may be formed by the following steps:

forming a source-drain metal layer pattern of the mother substrate for display substrates and the recess-protrusion structure 7 through a single patterning process without an extra patterning process to form the recess-protrusion structure 7, which can reduce the manufacture cost of the mother substrate for display substrates and improve the productivity of the mother substrate for display substrates; or forming a gate metal layer pattern of the mother substrate for display substrates and the recess-protrusion structure 7 through a single patterning process without an extra patterning process to form the recess-protrusion structure 7, which can reduce the manufacture cost of the mother substrate for display substrates and improve the productivity of the mother substrate for di splay substrates.

In forming the source-drain metal layer pattern of the mother substrate for display substrates and the recess-protrusion structure 7 through a single patterning process, the recess-protrusion structure 7 and the source-drain metal layer pattern may be formed by only adding a mask pattern for forming the recess-protrusion structure 7 to a mask for forming the source-drain metal layer pattern and patterning a source-drain metal layer with the mask which includes the mask pattern for forming the recess-protrusion structure 7. In forming the gate metal layer pattern of the mother substrate for display substrates and the recess-protrusion structure 7 through a single patterning process, the recess-protrusion structure 7 and the gate metal layer pattern may be formed by only adding a mask pattern for forming the recess-protrusion structure 7 to a mask for forming the gate metal layer pattern and patterning a gate metal layer with the mask which includes the mask pattern for forming the recess-protrusion structure 7.

Unless otherwise defined, any technical or scientific terms used herein shall have the common meanings understood by a person of ordinary skills. Terms such as "first" and "second" used in the present disclosure are merely used to differentiate different components rather than to represent any order, quantity or importance. Terms such as "include" or "contain" indicate that an element or object before such terms covers an element, an object or the equivalent enumerated after such terms, and do not exclude other elements and objects. Terms such as "connect" or "couple" are not used to limit physical or mechanical connection, and they may be direct or indirect electrical connection. Terms such as "on", "under", "left" and "right" are merely used to represent relative position relationships, and when an absolute position of a described object is changed, relative positions with respect to the described object may change correspondingly.

It can be appreciated that, if an element such as a layer, a film, a region or a substrate is described to be "on" or "under" another element, the element may be directly "on" or "under" the another element, or there may be an intermediate element between the element and the another element.

The above descriptions are merely optional embodiments of the present disclosure. It should be noted that, those skilled in the art may make improvements and polishments without departing from the principle of the present disclosure, and these improvements and polishments shall also fall within the protection scope of the present disclosure.

What is claimed is:

1. A display substrate, comprising a display element formation region and a recess-protrusion structure surrounding the display element formation region, wherein the recess-protrusion structure comprises a plurality of recesses and protrusions which are arranged alternately;
    wherein the recesses and the protrusions are made of a same material;
    wherein a width of a protrusion located in a middle region of the recess-protrusion structure is greater than a width of each protrusion located in a marginal region of the recess-protrusion structure.

2. The display substrate according to claim 1, wherein a bottom of the recess is higher than a bottom of the protrusion.

3. The display substrate according to claim 1, wherein a bottom width of the protrusion is smaller than a top width of the protrusion.

4. The display substrate according to claim 1, wherein the protrusion is continuously formed surrounding the display element formation region; and/or the recess is continuously formed surrounding the display element formation region.

5. The display substrate according to claim 1, wherein the recess-protrusion structure is covered with a protective film, and a height difference between the protrusion and the recess is greater than a thickness of the protective film.

6. The display substrate according to claim 1, wherein the recess-protrusion structure is formed of an organic material or a metal material.

7. The display substrate according to claim 6, wherein the recess-protrusion structure is formed of a metal material; and the recess-protrusion structure and a source-drain metal layer pattern of the display substrate are formed of a same material, or the recess-protrusion structure and a gate metal layer pattern of the display substrate are formed of a same material.

8. A mother substrate for display substrates, comprising a plurality of display element formation regions and a dividing line surrounding each of the plurality of display element formation regions;
    wherein a recess-protrusion structure is provided between the dividing line and the display element formation region, the recess-protrusion structure comprises a plurality of recesses and protrusions which are arranged alternately, and extension directions of the protrusion and the recess are identical to an extension direction of the dividing line;
    wherein the recesses and the protrusions are made of a same material;

wherein a width of a protrusion located in a middle region of the recess-protrusion structure is greater than a width of each protrusion located in a marginal region of the recess-protrusion structure.

9. The mother substrate for display substrates according to claim 8, wherein a bottom of the recess is higher than a bottom of the protrusion.

10. The mother substrate for display substrates according to claim 8, wherein a bottom width of the protrusion is smaller than a top width of the protrusion.

11. The mother substrate for display substrates according to claim 8, wherein the protrusion is continuously formed surrounding the display element formation region; and/or the recess is continuously formed surrounding the display element formation region.

12. The mother substrate for display substrates according to claim 8, wherein the recess-protrusion structure is covered with a protective film.

13. The mother substrate for display substrates according to claim 12, wherein a height difference between the protrusion and the recess is greater than a thickness of the protective film.

14. The mother substrate for display substrates according to claim 8, wherein the recess-protrusion structure is formed of an organic material or a metal material.

15. The mother substrate for display substrates according to claim 14, wherein the recess-protrusion structure is formed of a metal material; and
the recess-protrusion structure and a source-drain metal layer pattern of the mother substrate for display substrates are formed of a same material, or the recess-protrusion structure and a gate metal layer pattern of the mother substrate for display substrates are formed of a same material.

16. A display substrate, formed by dividing the mother substrate for display substrates according to claim 8.

17. A display device, comprising the display substrate according to claim 16.

18. A method for manufacturing a mother substrate for display substrates, the mother substrate for display substrates comprising a plurality of display element formation regions and a dividing line surrounding each of the plurality of display element formation regions, wherein the method comprises:
    forming a material layer at least at a region between the dividing line and the display element formation region, and patterning the material layer to form a recess-protrusion structure, wherein the recess-protrusion structure comprises a plurality of recesses and protrusions which are arranged alternately, and extension directions of the protrusion and the recess are identical to an extension direction of the dividing line;
    wherein the recesses and the protrusions are made of a same material;
    wherein a width of a protrusion located in a middle region of the recess-protrusion structure is greater than a width of each protrusion located in a marginal region of the recess-protrusion structure.

19. The method for manufacturing the mother substrate for display substrates according to claim 18, wherein after forming the recess-protrusion structure, the method further comprises:
    forming a protective film on the recess-protrusion structure.

20. The method for manufacturing the mother substrate for display substrates according to claim 18, wherein forming the recess-protrusion structure comprises;
    forming a source-drain metal layer pattern and the recess-protrusion structure of the mother substrate for display substrates through a single patterning process; or
    forming a gate metal layer pattern and the recess-protrusion structure of the mother substrate for display substrates through a single patterning process.

* * * * *